United States Patent
Xian et al.

(10) Patent No.: US 9,741,746 B2
(45) Date of Patent: Aug. 22, 2017

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Jianbo Xian, Beijing (CN); Hongfei Cheng, Beijing (CN); Wenbo Li, Beijing (CN); Yong Qiao, Beijing (CN); Pan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 34 days.

(21) Appl. No.: 14/891,086

(22) PCT Filed: Apr. 20, 2015

(86) PCT No.: PCT/CN2015/076941
§ 371 (c)(1),
(2) Date: Nov. 13, 2015

(87) PCT Pub. No.: WO2016/107017
PCT Pub. Date: Jul. 7, 2016

(65) Prior Publication Data
US 2016/0197098 A1 Jul. 7, 2016

(30) Foreign Application Priority Data
Jan. 4, 2015 (CN) ...................... 2015 2 0003241 U (51) Int. Cl.
*H01L 27/12* (2006.01)
*G02F 1/1362* (2006.01)

(52) U.S. Cl.
CPC ...... *H01L 27/124* (2013.01); *G02F 1/136286* (2013.01); *H01L 27/1222* (2013.01);
(Continued)

(58) Field of Classification Search
CPC ............... H01L 27/124; H01L 27/1222; H01L 27/1248; H01L 27/1259
(Continued)

(56) References Cited

U.S. PATENT DOCUMENTS 7,247,995 B2 * 7/2007 Osame ................ G09G 3/3275
257/66
7,592,980 B2 * 9/2009 Yamazaki ............ G09G 3/3233
257/40

(Continued)

FOREIGN PATENT DOCUMENTS

CN 1470907 A 1/2004
CN 101078823 A 11/2007

(Continued)

OTHER PUBLICATIONS

International Search Report of PCT/CN2015/076941 in Chinese, mailed Sep. 24, 2015 with English translation.

(Continued)

*Primary Examiner* — Mark Prenty
(74) *Attorney, Agent, or Firm* — Collard & Roe, P.C.

(57) ABSTRACT

An array substrate, a manufacturing method thereof and a display device are provided. The array substrate comprises a plurality of gate lines (102) and a plurality of data lines (101); a region defined by adjacent data lines (101) and adjacent gate lines (102) is a pixel unit; the pixel unit includes a common electrode line (103), a pixel electrode (104), a thin film transistor (105) and an auxiliary electrode (202); a first end of the auxiliary electrode (202) is electrically connected with a drain electrode (203) of the thin film transistor (105); and a second end of the auxiliary electrode (202) is electrically connected with the pixel electrode (104). The array substrate is used for enhancing an electric field within the peripheral range of the pixel electrode (104) of the (Continued)

pixel unit and avoiding the phenomenon of light leakage at an edge of the pixel unit.

16 Claims, 5 Drawing Sheets

(52) U.S. Cl.
CPC ...... *H01L 27/1248* (2013.01); *H01L 27/1259* (2013.01); *G02F 2001/136218* (2013.01)

(58) Field of Classification Search
USPC .......................................................... 257/72
See application file for complete search history.

(56) References Cited

U.S. PATENT DOCUMENTS

| 7,796,202 | B2 | 9/2010 | Hwang et al. |
| 8,953,133 | B2 | 2/2015 | Cho et al. |
| 2006/0175610 | A1 | 8/2006 | Heo et al. |
| 2013/0043477 | A1 | 2/2013 | Jang et al. |
| 2016/0197098 | A1* | 7/2016 | Xian .................. H01L 27/1222 257/72 |

FOREIGN PATENT DOCUMENTS

| CN | 101256328 A | 9/2008 |
| CN | 102902118 A | 1/2013 |

OTHER PUBLICATIONS

Notice of Transmittal of the International Search Report of PCT/CN2015/076941 in Chinese, mailed Sep. 24, 2015.
Written Opinion of the International Searching Authority of PCT/CN2015/076941 in Chinese, mailed Sep. 24, 2015 with English translation.

* cited by examiner

FIG. 1

(Prior Art)

ARRAY SUBSTRATE, MANUFACTURING METHOD THEREOF AND DISPLAY DEVICE

CROSS REFERENCE TO RELATED APPLICATIONS

This application is the National Stage of PCT/CN2015/076941 filed on Apr. 20, 2015, which claims priority under 35 U.S.C. §119 of Chinese Application No. 201520003241.1 filed on Jan. 4, 2015, the disclosure of which is incorporated by reference.

TECHNICAL FIELD

At least one embodiment of the present invention relates to an array substrate, a manufacturing method thereof and a display device.

BACKGROUND

Liquid crystal display (LCD) technology is currently the most widely used display technology and mainly applied in TVs, mobile phones and public information display devices. In an LCD device, the color of transmitted light is changed by utilization of different refraction angles by the control of the deflection angle of liquid crystal molecules. In the LCD device, an electric field is changed by the change of voltage on an array substrate, so that the deflection direction of the liquid crystal molecules is controlled, and hence the liquid crystal molecules reveal different light-shielding properties and light-transmitting properties at different angles. On the basis of the principle, a required image may be formed by the control of each pixel unit.

SUMMARY

Embodiments of the present invention provide an array substrate, a manufacturing method thereof and a display device, by additionally arranging an auxiliary electrode on at least one of peripheries of a pixel electrode of a pixel unit, which are used for enhancing an electric field within the region and increasing the deflection angle of liquid crystal molecules within the region, and hence avoiding the phenomenon of light leakage at an edge of the pixel unit.

At least one embodiment of the present invention provides an array substrate, which comprises a plurality of gate lines and a plurality of data lines, wherein a region defined by adjacent data lines and adjacent gate lines is a pixel unit; the pixel unit comprises a pixel electrode, a thin film transistor and an auxiliary electrode; a first end of the auxiliary electrode is electrically connected with a drain electrode of the thin film transistor, and a second end of the auxiliary electrode is electrically connected with the pixel electrode.

At least one embodiment of the present invention further provides a display device, which comprises the foregoing array substrate.

At least one embodiment of the present invention further provides a method for manufacturing an array substrate. The manufacturing method comprises: forming a plurality of gate lines and a plurality of data lines, wherein a region defined by adjacent data lines and adjacent gate lines is a pixel unit; and forming a pixel electrode, a thin film transistor and a auxiliary electrode comprised in the pixel unit, in which a first end of the auxiliary electrode is electrically connected with a drain electrode of the thin film transistor and a second end of the auxiliary electrode is electrically connected with the pixel electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
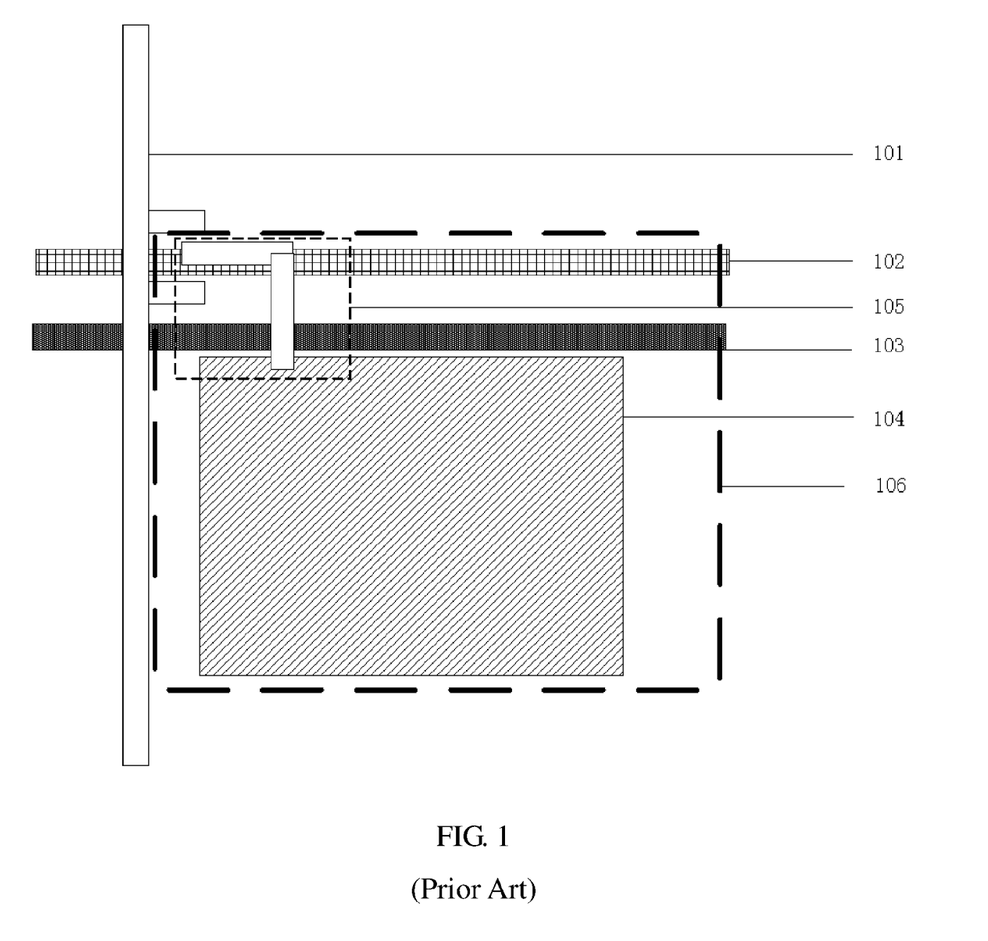
FIG. 1 is a schematic structural view of an array substrate.

In an LCD device, as for at least a part of a plurality of pixel units, each pixel unit is defined by adjacent data lines 101 and adjacent gate lines 102 in an array substrate. As illustrated in FIG. 1, the array substrate comprises data lines 101, gate lines 102 and pixel units 106 defined by the data lines 101 and the gate lines 102. The pixel unit 106 includes a common electrode line 103, a pixel electrode 104 and a TFT 105. The common electrode line 103 and the gate line 102 are arranged in the same layer. The pixel electrode 104 and the common electrode line 103 or the gate line 102 are not arranged in the same layer.

The inventors of the application have noted in the study that: as an electric field at a peripheral region of a pixel electrode is weak, the deflection difficulty of liquid crystal molecules within the region is relatively large, so that the phenomenon of light leakage tends to occur at an edge of the pixel unit within the range.

Embodiments of the present invention provide an array substrate and a display device, which can enhance the electric field at a periphery of the pixel electrode and increase the deflection angle of liquid crystal molecules within the range by additionally arranging an auxiliary electrode in at least one periphery of the pixel electrode of a pixel unit, and hence avoiding the phenomenon of light leakage at an edge of the pixel unit.

At least one embodiment of the present invention provides an array substrate, which comprises a plurality of gate lines and a plurality of data lines. A region defined by adjacent data lines and adjacent gate lines is a pixel unit, the pixel unit includes: a common electrode line, a pixel electrode, a TFT and an auxiliary electrode. A first end (input end) and a second end (output end) of the auxiliary electrode are respectively electrically connected with a drain electrode of the TFT and the pixel electrode.

By additional arrangement of the auxiliary electrode at the periphery of the pixel electrode of the pixel unit, the electric field at the periphery of the pixel electrode can be enhanced and the deflection angle of the liquid crystal molecules within the range can be increased, and hence the phenomenon of light leakage at the edge of the pixel unit can be avoided.

In the array substrate provided by at least one embodiment, the pixel unit further includes the common electrode line; and the auxiliary electrode is disposed on a side of the common electrode line away from the pixel electrode.

As illustrated in FIG. 1, an electric field may be formed by the common electrode line and the pixel electrode in a region which is positioned on a side of the common electrode line close to the pixel electrode, and an electric field in an region which is positioned on a side of the common electrode line away from the pixel electrode is weak. Therefore, when the auxiliary electrode is disposed on the side of the common electrode line away from the pixel electrode, the electric field on the periphery of the pixel electrode can be effectively enhanced.

The common electrode line may be disposed between the pixel electrode and the gate line or between the pixel electrode and the data line. Therefore, in at least one embodiment, in a direction parallel to a plane where the array substrate is positioned, the auxiliary electrode may be disposed between the common electrode line and the gate line or between the common electrode line and the data line. The direction parallel to the plane where the array substrate is positioned may be a direction substantially parallel to the plane where the array substrate is positioned.

In at least one embodiment, the auxiliary electrode may be parallel to the common electrode line.

In at least one embodiment, the pixel unit includes a plurality of auxiliary electrodes disposed at the periphery of the pixel electrode. By arrangement of the plurality of auxiliary electrodes disposed on the periphery of the pixel electrode, an electric field formed between the auxiliary electrode and the common electrode line may be enhanced, and hence the phenomenon of non-uniform fringe fields of the pixel electrode can be avoided.

For instance, the pixel unit may further include an auxiliary common electrode line connected with the common electrode line. At least a part of the plurality of auxiliary electrodes may be disposed on a side of the auxiliary common electrode line away from the pixel electrode.

In the embodiment of the present invention, an extension direction of the auxiliary common electrode line crosses with an extension direction of the common electrode line. For instance, the extension direction of the common electrode line may be the same with an extension direction of one of the gate line and the data line, and the extension direction of the auxiliary common electrode line may be the same with an extension direction of the other of the gate line and the data line. For instance, adjacent common electrode lines may be connected with each other through the same auxiliary common electrode line, or the auxiliary common electrode lines of the adjacent common electrode lines may be not connected with each other.

In an embodiment of the present invention, the phenomenon of non-uniform fringe fields of the pixel electrode can be avoided by arrangement of at least one auxiliary electrode.

In at least one embodiment, the auxiliary electrode and the pixel electrode may be connected with each other through a connecting line. For instance, the connecting line includes a plurality of connecting lines. For instance, each of the plurality of auxiliary electrodes corresponds to at least one connecting line.

For instance, the pixel electrode includes at least two connecting lines. The connecting lines are in parallel connection, and at least one connecting line is connected with a tail end of the auxiliary electrode.

In the embodiment of the present invention, the common electrode line and the gate line are arranged in the same layer, and the pixel electrode and the gate line are arranged in different layers. As the common electrode line is usually arranged in the same layer with the gate line, in order to reduce the interference of a capacitance between the common electrode line and the gate line on the electric field of the pixel electrode, a certain spacing distance needs to be provided between the common electrode line and the gate line, so that the electric field in an region between the common electrode line and the gate line is relatively weak. In the embodiment of the present invention, the common electrode line and the auxiliary electrode may form an electric field between the common electrode line and the gate line, so that the deflection angle of liquid crystal molecules can be increased. As the pixel electrode and the gate line are not arranged in the same layer, the spacing between the common electrode line and the gate line can be effectively utilized.

In at least one embodiment, the auxiliary electrode and the pixel electrode may be arranged in the same layer and may also be arranged in different layers.

For instance, the auxiliary electrode is connected with a drain electrode of the TFT via a first through hole, or overlaps and is directly connected to the drain electrode of the TFT, and is connected with the pixel electrode in the same layer.

For instance, the auxiliary electrode is connected with a drain electrode of the TFT via a first through hole, or overlaps and is directly connected to the drain electrode of the TFT, and is connected with the pixel electrode via a second through hole.

Further description will be given below to the array substrate provided by the embodiment of the present invention with reference to the accompanying drawings.

Figure 2A:
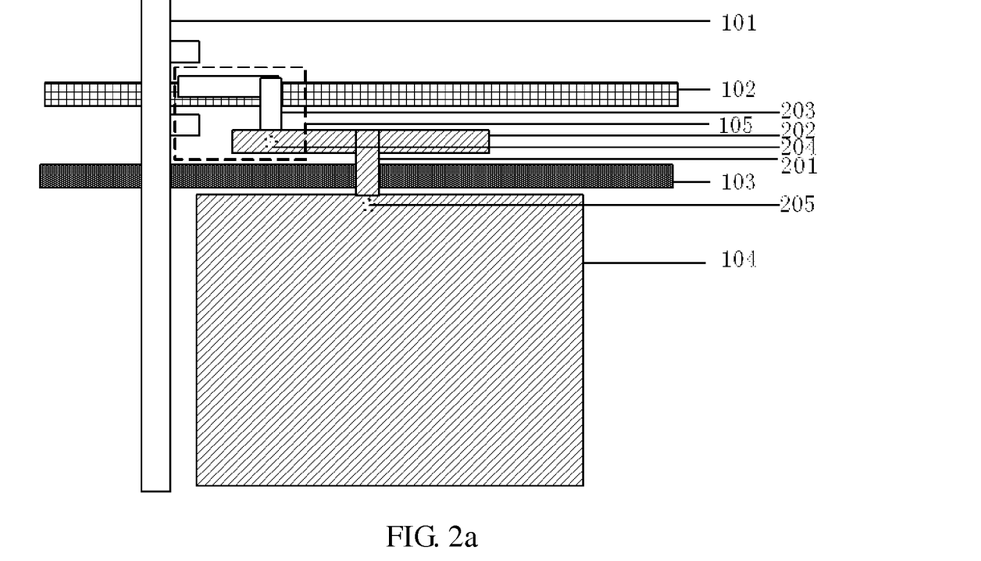
FIG. 2a is a schematic structural view of an array substrate provided by an embodiment of the present invention.

As illustrated in FIG. 2a which illustrates one pixel unit of the array substrate provided by a first embodiment of the present invention, the pixel unit includes a data line 101, a gate line 102, a common electrode line 103, a pixel electrode 104, a TFT 105, a first connecting line 201 and an auxiliary electrode 202. By additional arrangement of the auxiliary electrode on at least one periphery of the pixel electrode of the pixel unit, an electric field at the periphery of the pixel electrode can be enhanced and the deflection angle of the liquid crystal molecules within the range can be increased, and hence the phenomenon of light leakage at an edge of the pixel unit can be avoided.

In one embodiment, the auxiliary electrode 202 is arranged in different layers with the pixel electrode 104 and a drain electrode of the TFT 105 and arranged in the same layer with the first connecting line 201. For instance, a first end of the auxiliary electrode 202 is connected with the drain electrode of the TFT 105 via a first through hole 204, and a second end of the auxiliary electrode 202 is directly connected with the first connecting line 201 which is connected with the pixel electrode 104 via a second through hole 205.

In another embodiment, the auxiliary electrode 202 is arranged in different layers with the pixel electrode 104 and the drain electrode of the TFT 105 and arranged in different layers with the first connecting line 201. For instance, the first end of the auxiliary electrode 202 is connected with the drain electrode of the TFT 105 via the first through hole 204 and the second end of the auxiliary electrode 202 is connected with the first connecting line 201 via a through hole (not shown); and the first connecting line 201 is connected with the pixel electrode 104 via the second through hole 205.

In still another embodiment, the auxiliary electrode 202 is arranged in different layers with the drain electrode of the TFT 105; the first end of the auxiliary electrode 202 is connected with the drain electrode of the TFT 105 via the first through hole 204; and the auxiliary electrode 202 is arranged in the same layer with the pixel electrode 104 and the first connecting line 201. For instance, the auxiliary electrode 202, the pixel electrode 104 and the first connecting line 201 are made form same material and formed by using the same mask.

Description is given in the above embodiments only by taking a case that the auxiliary electrode 202 and the drain electrode of the TFT are arranged in different layers as an example. But the auxiliary electrode 202 and the drain electrode of the TFT may also be arranged in the same layer. No further description will be given here.

In order to better utilize the distance between the common electrode line 103 and the gate line 102, the auxiliary electrode 202 is disposed between the common electrode line 103 and the gate line 102 and parallel to the common electrode line 103; a first end (input end) of the auxiliary electrode 202 is connected with the drain electrode 203 of the TFT 105; and a second end (output end) of the auxiliary electrode 202 is connected with the pixel electrode 104 via the first connecting line 201, namely the second end of the auxiliary electrode 202 is electrically connected with the pixel electrode 104.

By utilization of large distance between the common electrode line and the gate line, the auxiliary electrode may be more easily arranged. As the pixel electrode and the gate line are not arranged in the same layer, the spacing between the common electrode line and the gate line can be effectively utilized. Moreover, by additional arrangement of the auxiliary electrode between the common electrode line and the gate line, the common electrode line and the auxiliary electrode may form an electric field between the common electrode line and the gate line, so that the electric field in the region can be enhanced and the deflection angle of the liquid crystal molecules in the region can be increased, and hence the phenomenon of light leakage at an edge of the pixel unit can be avoided.

In the embodiment of the present invention, the auxiliary electrode may be slightly overlapped with the common electrode line. However, due to exposure accuracy, there is a certain distance between the common electrode line and the gate line, so that an electric field in the region is relatively weak. Therefore, as shown in FIG. 2a, a position of the auxiliary electrode is a position between the common electrode line and the gate line, thus, the better effect can be obtained. Therefore, the common electrode line and the auxiliary electrode may form an electric field between the common electrode line and the gate line, and hence the deflection angle of the liquid crystal molecules can be increased. As the pixel electrode and the gate line are not arranged in the same layer, the spacing between the common electrode line and the gate line can be effectively utilized.

Figure 2B:
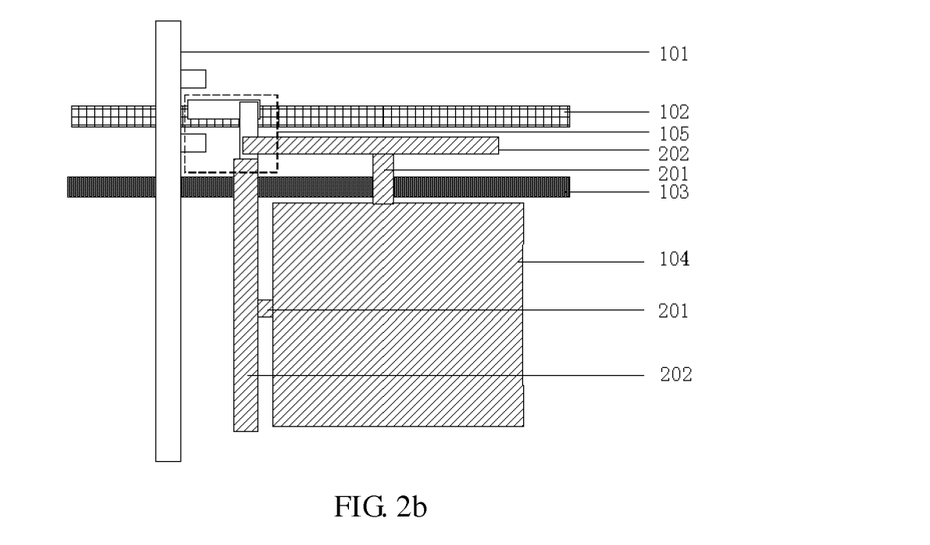
FIG. 2b is a schematic structural view of an array substrate comprising a plurality of auxiliary electrodes, provided by an embodiment of the present invention.

As illustrated in FIG. 2b which illustrates one pixel unit of the array substrate provided by a second embodiment of the present invention, the pixel unit not only includes the data line 101, the gate line 102, the common electrode line 103, the pixel electrode 104 and the TFT 105 as shown in FIG. 2a but also includes a plurality of first connecting lines 201 and auxiliary electrodes 202 each connected with each of the first connecting lines 201 respectively.

Figure 2C:
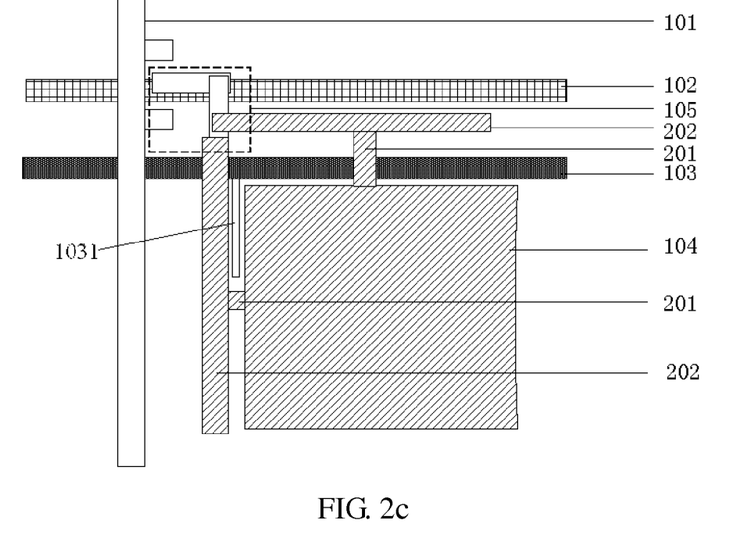
FIG. 2c is a schematic structural view of an array substrate provided by an embodiment of the present invention, in which a pixel unit includes an auxiliary common electrode line.

FIG. 2c is a schematic structural view of an array substrate provided by the embodiment of the present invention, in which the pixel unit includes an auxiliary common electrode line. As illustrated in FIG. 2c, the auxiliary electrode disposed between the pixel electrode 104 and the data line 101 is disposed between an auxiliary common electrode line 1031 and the data line 101. The auxiliary common electrode line 1031 and the common electrode line 103 may be arranged in the same layer and formed by using the same mask process, and of course, may also be arranged in different layers.

By arrangement of a plurality of auxiliary electrodes on a plurality of peripheries of the pixel electrode respectively, the electric field between the auxiliary electrode and the common electrode line can be enhanced, so that the phenomenon of non-uniform fringe field of the pixel electrode can be avoided.

Figure 3:
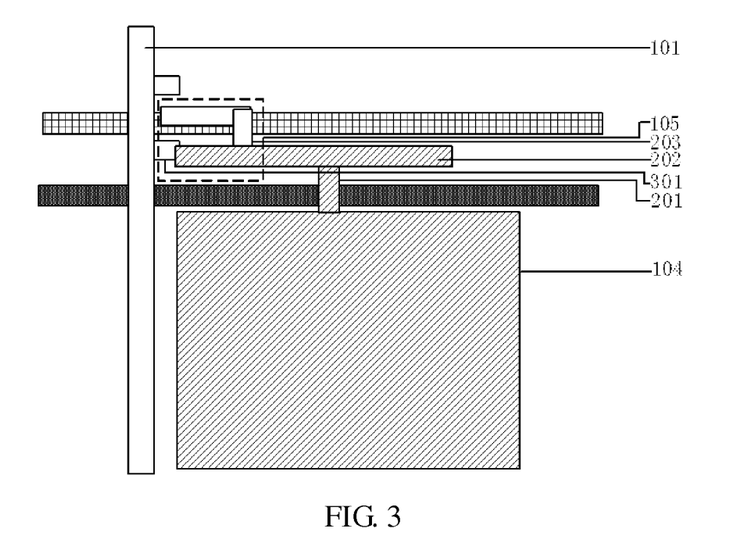
FIG. 3 is a schematic structural view of an array substrate provided by an embodiment of the present invention, in which an auxiliary electrode is overlapped with a source electrode.

On the basis of FIG. 2a, the auxiliary electrode 202 is moved towards the data line 101, so that a schematic structural view as shown in FIG. 3 can be obtained. FIG. 3 illustrates one pixel unit of the array substrate provided by a third embodiment of the present invention.

As illustrated in FIG. 3, the auxiliary electrode 202 is connected with a drain electrode 203 of the TFT 105, is connected with the pixel electrode 104 via the first connecting line 201, and is also partially overlapped with a source electrode 301 of the TFT 105.

As illustrated in FIG. 3, the auxiliary electrode 202 is partially overlapped with the source electrode 301 of the TFT 105 by using the position movement, which facilitates repairing of the pixel electrode 104. That is to say, the auxiliary electrode 202 and the source electrode 301 of the TFT 105 are mutually insulated and partially overlapped under a normal condition. When the TFT 105 operates abnormally (e.g., is damaged), the auxiliary electrode 202 may be electrically connected with the source electrode 301 overlapped with the auxiliary electrode 202 by using, for instance, repair operations such as welding, so that the pixel electrode can normally operate.

On the basis of FIG. 2a, at least one connecting line in parallel connection with the first connecting line 201 is additionally arranged at an end of the auxiliary electrode 202. The plurality of connecting lines are connected in parallel to the auxiliary electrode, a resistance of the connecting lines can be reduced and the transmission speed can be accelerated.

Figure 4:
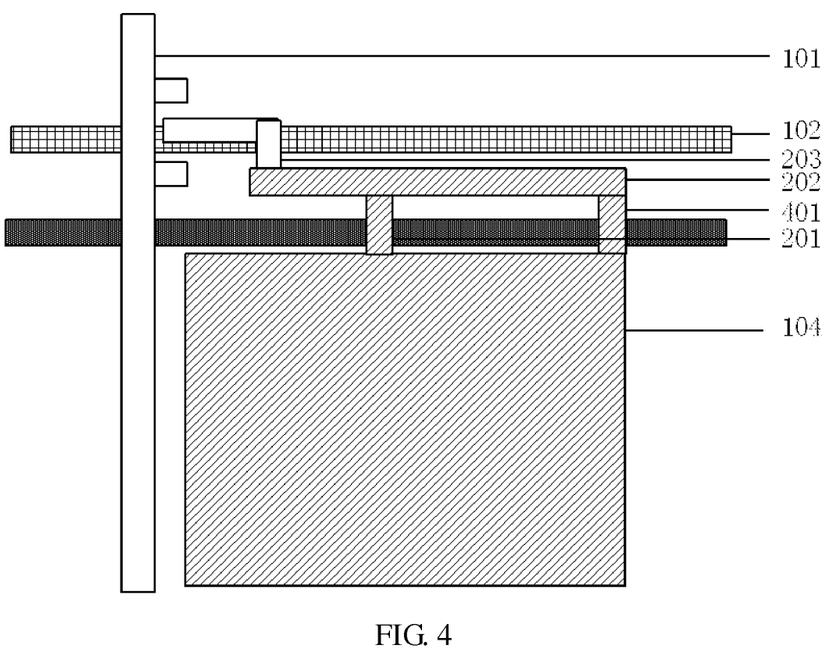
FIG. 4 is a schematic structural view of an array substrate comprising two connecting lines, provided by an embodiment of the present invention.

As illustrated in FIG. 4 which illustrates one pixel unit of an array substrate provided by a fourth embodiment of the present invention, the pixel unit further includes a second connecting line 401 in parallel connection with the first connecting line 201, and the second connecting line 401 is disposed at a tail end of the auxiliary electrode 202.

A first end of the auxiliary electrode 202 is connected with a drain electrode 203 of the TFT, and a second end of the auxiliary electrode 202 is connected with the pixel electrode 104 via the first connecting line 201. The auxiliary electrode 202 is also connected with the pixel electrode 104 via the second connecting line 401. By arrangement of a parallel connecting line connected with the pixel electrode and the auxiliary electrode, the resistance of the connecting line can be reduced and the transmission speed can be accelerated.

The shape and the size of the auxiliary electrode and the shape and the structure of the plurality of connecting lines are not limited to the above embodiments of the present invention. The embodiments of the present invention are only provided for better understanding of the present invention.

Description will be given below to a method for manufacturing an array substrate, provided by an embodiment of the present invention, from the aspect of process flow.

At least one embodiment of the present invention further provides a method for manufacturing the array substrate provided by any of the above embodiments. The manufacturing method comprises: forming a plurality of gate lines and a plurality of data lines, so that a region defined by adjacent data lines and adjacent gate lines is taken as a pixel unit; and forming a pixel electrode, a TFT and a auxiliary electrode comprised in the pixel unit, so that a first end of the auxiliary electrode is electrically connected with a drain electrode of the TFT and a second end of the auxiliary electrode is electrically connected with the pixel electrode. The first end is an input end, and the second end is an output end.

In at least one embodiment, the pixel unit further includes a common electrode line, and the auxiliary electrode is disposed on a side of the common electrode line away from the pixel electrode.

Figure 5:
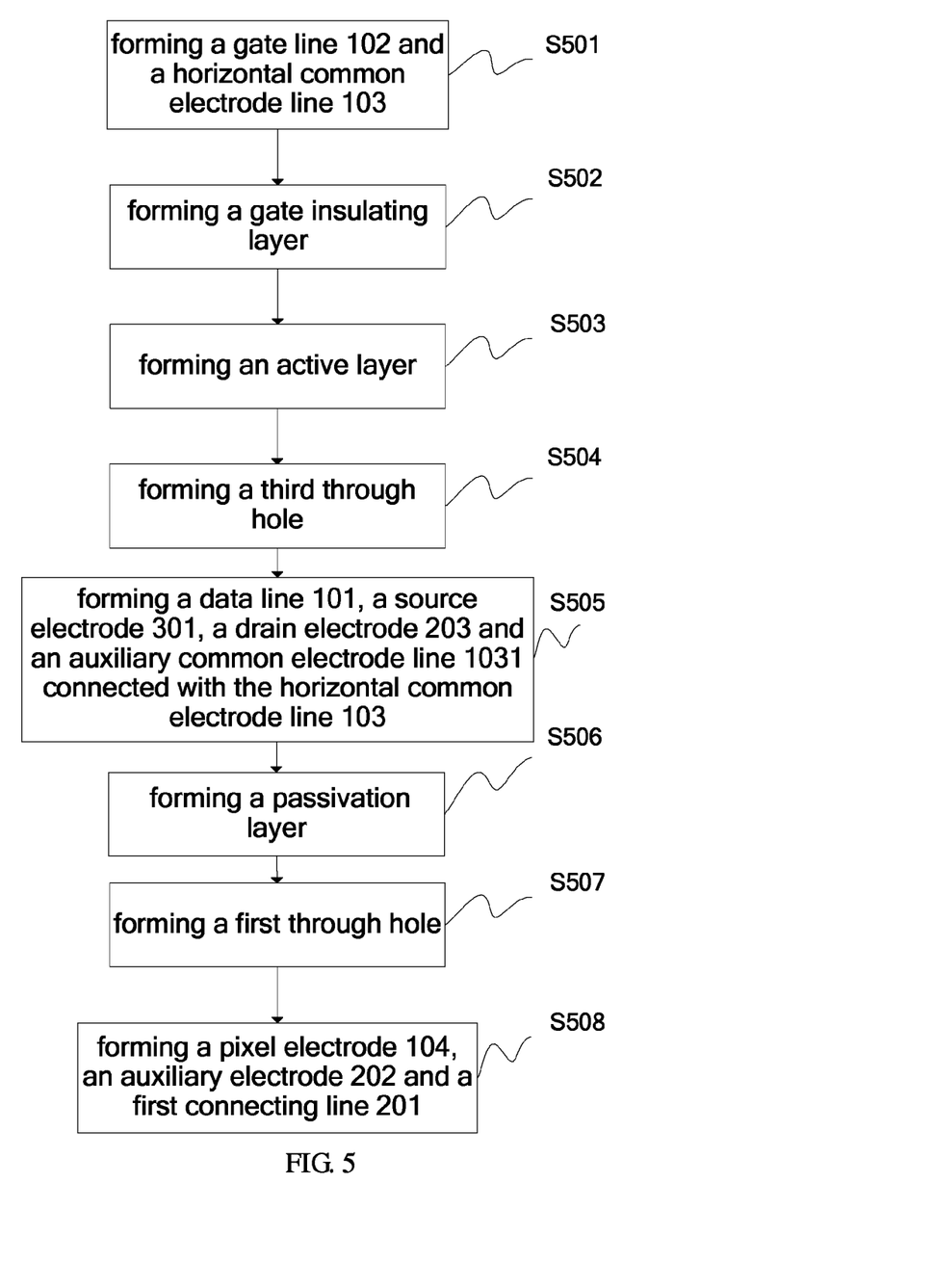
FIG. 5 is a flowchart of a method for manufacturing an array substrate, provided by an embodiment of the present invention.

For instance, description is given in FIG. 5 by taking a case that the auxiliary electrode, the pixel electrode and the connecting line connected with the auxiliary electrode and the pixel electrode, in the array substrate as shown in FIG. 2a are arranged in the same layer and the pixel unit includes an auxiliary common electrode line as an example. As illustrated in FIG. 5, the method, for instance, comprises the steps S501 to S508. The steps will be described below one by one.

S501: forming a gate line 102, a pattern of a gate electrode and a horizontal common electrode line 103 by, for instance, depositing a metal layer using sputtering, coating a photoresist, exposure and development, and etching. For instance, the gate line 102 and the common electrode line 103 may be made from a metal material such as copper (Cu), aluminum (Al), molybdenum (Mo), titanium (Ti), chromium (Cr) and tungsten (W) and may also be made from an alloy of the above materials; and the gate line 102 may be a single-layer structure and may also be a multi-layer structure. As the gate line is usually horizontally arranged, the common electrode line 103 may also be correspondingly horizontally arranged. Description is given here only by taking a case that the common electrode line 103 is a horizontal common electrode line as an example. But the embodiments of the present invention are not limited thereto.

S502: forming a pattern of a gate insulating layer by, for instance, plasma enhanced chemical vapor deposition (PECVD) method. For instance, the gate insulating layer may be made from a material such as silicon nitride and silicon oxide; and the gate insulating layer may be a single-layer structure and may also be a multi-layer structure.

S503: forming a pattern of an active layer by depositing a semiconductor layer, for instance, continuously depositing amorphous silicon (a-Si) and polycrystalline silicon (n+a-Si) using PECVD or depositing indium gallium zinc oxide (IGZO) on the gate insulating layer, coating a photoresist, exposure and development, and etching. For instance, the active layer may be made from a material such as a-Si and oxide semiconductor.

S504: forming a third through hole at a position corresponding to the common electrode line 103 by coating a photoresist, exposure and development, and etching, and exposing the horizontal common electrode line 103 via the formed third through hole. For instance, the third through hole may be formed in the gate insulating layer. For instance, an insulating layer may be formed on the active layer, and subsequently, the third through hole running through the insulating layer and the gate insulating layer is formed. No limitation will be given here.

S505: forming a pattern of a data line 101, a source electrode 301, a drain electrode 203 and an auxiliary common electrode line 1031 (e.g., vertically extended) by depositing a metal layer using sputtering, coating a photoresist, exposure and development, and etching, and connecting the horizontal common electrode line 103 to the auxiliary common electrode line 1031 via the third through hole formed in the step S504. For instance, the data line 101 may be made from a metal material such as copper (Cu), aluminum (Al), molybdenum (Mo), titanium (Ti), chromium (Cr) and tungsten (W).

S506: forming a passivation layer by deposition. For instance, silicon nitride is deposited by PECVD, or a resin layer is coated. For instance, the passivation layer may be made from inorganic material such as silicon nitride.

S507: forming a first through hole on the passivation layer by coating a photoresist, exposure and development, and etching, and exposing the drain electrode 203 of the TFTs via the formed first through hole.

S508: forming a pixel electrode 104, an auxiliary electrode 202 and a first connecting line 201 by sputtering a conductive material layer, coating a photoresist, exposure and development, and etching, in which a first end of the auxiliary electrode 202 is electrically connected with the drain electrode 203 of the TFT via the first through hole formed in the step S507, and a second end of the auxiliary electrode 202 is electrically connected with the pixel electrode 104 via the first connecting line 201. For instance, the pixel electrode 104 may be made from transparent metal oxide conductive material such as indium tin oxide (ITO) or indium zinc oxide (IZO).

The array substrate manufactured by the manufacturing method provided by an embodiment of the present invention may refer to the array substrate provided by any foregoing embodiment. No further description will be given here.

In the array substrate and the manufacturing method thereof, provided by the embodiments of the present invention, the array substrate may only be provided with a pixel electrode and may also be provided with the pixel electrode and a common electrode (e.g., arranged in the same layer or different layers). In addition, an auxiliary electrode, a connecting line for connecting the pixel electrode and the auxiliary electrode, and an auxiliary common electrode line may be made from material which is used to form original conductive structures (e.g., a source/drain electrode, the pixel electrode and the common electrode) which have been formed on the array substrate, and may also be formed by additional arrangement of a conductive layer on the array substrate. No further description will be given here.

On the basis of the same inventive concept, at least one embodiment of the present invention further provides a display device, which comprises any array substrate provided by the embodiments of the present invention.

For instance, the display device may be an LCD device. For instance, the display device may be any product or component with display function such as an LCD panel, e-paper, a mobile phone, a tablet PC, a TV, a display, a notebook computer, a digital picture frame and a navigator.

In summary, with regard to the array substrate, the manufacturing method thereof and the LCD device, provided by the embodiments of the present invention, the auxiliary electrode may be additionally arranged in at least one of peripheries of the pixel electrode of the pixel unit, so that an electric field within the region can be enhanced and the deflection angel of liquid crystal molecules within the region can be increased, and hence the phenomenon of light leakage at an edge of the pixel electrode can be avoided; the auxiliary electrode can be more easily arranged by utilization of large distance between the common electrode line and the gate line; as the pixel electrode and the gate line are not arranged in the same layer, the auxiliary electrode is disposed between the common electrode line and the gate line by effective utilization of the spacing between the common electrode line and the gate line, so that the electric field within the region can be enhanced; by arranging the plurality of auxiliary electrodes, the phenomenon of non-uniform fringe field of the pixel electrodes can be optimized; as the auxiliary electrode may be partially overlapped with the source electrode of the TFT, the pixel electrode can be conveniently repaired; and by arrangement of the plurality of parallel connecting lines connected with the pixel electrodes and the auxiliary electrodes, the resistance of the connecting line can be reduced and the transmission speed can be accelerated.

The foregoing is only the preferred embodiments of the present invention and not intended to limit the scope of protection of the present invention. The scope of protection of the present invention should be defined by the appended claims.

The application claims priority to the Chinese patent application No. 201520003241.1, filed Jan. 4, 2015, the disclosure of which is incorporated herein by reference as part of the application.

The invention claimed is:

1. An array substrate, comprising a plurality of gate lines and a plurality of data lines, wherein a region defined by adjacent data lines and adjacent gate lines is a pixel unit; the pixel unit comprises a pixel electrode, a thin film transistor and an auxiliary electrode;
   a first end of the auxiliary electrode is electrically connected with a drain electrode of the thin film transistor, and a second end of the auxiliary electrode is electrically connected with the pixel electrode; and
   wherein the pixel unit further comprises a common electrode line and the auxiliary electrode is disposed on a side of the common electrode line away from the pixel electrode.

2. The array substrate according to claim 1, wherein
   the auxiliary electrode is disposed between the common electrode line and the gate line in a direction parallel to a plane where the array substrate is positioned; or
   the auxiliary electrode is disposed between the common electrode line and the data line in a direction parallel to the plane where the array substrate is positioned.

3. The array substrate according to claim 1, wherein the auxiliary electrode is parallel to the common electrode line.

4. The array substrate according to claim 1, wherein the auxiliary electrode is parallel to the common electrode line.

5. The array substrate according to claim 1, wherein the common electrode line and the gate line are arranged in a same layer.

6. The array substrate according to claim 1, wherein the pixel unit comprises a plurality of auxiliary electrodes.

7. The array substrate according to claim 6, wherein the plurality of auxiliary electrodes are respectively disposed at peripheries of the pixel electrode.

8. The array substrate according to claim 7, wherein the pixel unit further comprises a common electrode line and an auxiliary common electrode line connected with the common electrode line, and at least one part of the plurality of auxiliary electrodes are disposed on a side of the auxiliary common electrode line away from the pixel electrode.

9. The array substrate according to claim 1, wherein the auxiliary electrode is connected with the drain electrode of the thin film transistor via a through hole or overlapped and directly connected to the drain electrode of the thin film transistor, and is connected with the pixel electrode in the same layer.

10. The array substrate according to claim 1, wherein a part of the auxiliary electrode is overlapped with a source electrode of the thin film transistor.

11. The array substrate according to claim 1, wherein the auxiliary electrode is electrically connected with the pixel electrode through a connecting line.

12. The array substrate according to claim 11, wherein the connecting line comprises a plurality of connecting lines.

13. The array substrate according to claim 12, wherein the pixel unit comprises at least two connecting lines, the connecting lines are in parallel connection, and at least one connecting line is connected with a tail end of the auxiliary electrode.

14. The array substrate according to claim 1, wherein the auxiliary electrode is connected with the drain electrode of the thin film transistor via a first through hole or overlapped and directly connected to the drain electrode of the thin film transistor, and is connected with the pixel electrode via a second through hole.

15. A display device, comprising the array substrate according to claim 1.

16. A method for manufacturing an array substrate, comprising:
   forming a plurality of gate lines and a plurality of data lines, wherein a region defined by adjacent data lines and adjacent gate lines is a pixel unit; and
   forming a pixel electrode, a thin film transistor and a auxiliary electrode comprised in the pixel unit, in which a first end of the auxiliary electrode is electrically connected with a drain electrode of the thin film transistor and a second end of the auxiliary electrode is electrically connected with the pixel electrode; and
   wherein the pixel unit further comprises a common electrode line, and the auxiliary electrode is disposed on a side of the common electrode line away from the pixel electrode.

* * * * *